US008917504B2

(12) United States Patent  
Medlin et al.

(10) Patent No.: US 8,917,504 B2
(45) Date of Patent: Dec. 23, 2014

(54) MODIFYING THE SPATIAL ORIENTATION OF A THERMAL ACOUSTIC PANEL OF A COMPUTING ENCLOSURE RACK

(75) Inventors: Billy W. Medlin, Cary, NC (US); Matthew L. Nickerson, Raleigh, NC (US); Nitin N. Pai, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 365 days.

(21) Appl. No.: 13/409,267

(22) Filed: Mar. 1, 2012

(65) Prior Publication Data
US 2013/0229771 A1    Sep. 5, 2013

(51) Int. Cl.
    *H05K 7/20*    (2006.01)
(52) U.S. Cl.
    USPC ............ 361/679.51; 361/679.46; 361/688
(58) Field of Classification Search
    USPC ......................................... 361/679.54
    See application file for complete search history.

(56) References Cited

U.S. PATENT DOCUMENTS

| 5,375,038 | A  | * | 12/1994 | Hardt ........................... 361/694 |
| D562,329 | S  |  | 2/2008 | Flanegan et al. |
| 7,334,662 | B1 |  | 2/2008 | Anderl et al. |
| 7,646,603 | B2 | * | 1/2010 | Bard et al. ....................... 361/696 |
| 7,656,660 | B2 |  | 2/2010 | Hoeft et al. |
| 7,663,881 | B2 | * | 2/2010 | Kuo ............................... 361/692 |
| 7,667,965 | B2 |  | 2/2010 | Nobile |
| 7,727,059 | B2 |  | 6/2010 | Merino |
| 7,903,403 | B2 | * | 3/2011 | Doll et al. ...................... 361/679.5 |
| 7,929,295 | B2 | * | 4/2011 | Joshi ............................. 361/679.5 |
| 7,986,526 | B1 |  | 7/2011 | Howard et al. |
| 8,464,961 | B2 | * | 6/2013 | Wu et al. ........................ 236/49.3 |
| 2005/0286223 | A1 | * | 12/2005 | Morales ......................... 361/690 |
| 2006/0144638 | A1 | * | 7/2006 | Radatus et al. ................ 181/224 |
| 2008/0004755 | A1 | * | 1/2008 | Dunstan et al. ............... 700/299 |
| 2008/0065245 | A1 | * | 3/2008 | Tang et al. ...................... 700/94 |
| 2008/0106864 | A1 | * | 5/2008 | Merino ........................... 361/688 |

(Continued)

FOREIGN PATENT DOCUMENTS

| JP | 05-156611 | 6/1993 |
| JP | 2001-279943 | 10/2001 |
| JP | 2009-64203 A | 3/2009 |
| WO | WO 2007/063178 A1 | 6/2007 |

OTHER PUBLICATIONS

IBM, "Segregated Airflow Acoustic Covers", IP.com Prior Art Database, IPCOM000159188D, Oct. 12, 2007, pp. 1-3, IP.com, USA.

(Continued)

*Primary Examiner* — Anthony Q Edwards
(74) *Attorney, Agent, or Firm* — Edward J. Lenart; Katherine S. Brown; Biggers Kennedy Lenart Spraggins LLP

(57) ABSTRACT

Methods, apparatuses, and computer program products for modifying the spatial orientation of a thermal acoustic panel of a computing enclosure rack are provided. Embodiments include receiving, by a configuration controller, a configuration preference from a user; identifying, by the configuration controller, a spatial orientation configuration corresponding to the configuration preference received from the user; and coordinating, by the configuration controller, movement of the thermal acoustic panel relative to a body of the computing enclosure rack in accordance with the identified spatial orientation configuration.

20 Claims, 7 Drawing Sheets

(56) References Cited

U.S. PATENT DOCUMENTS

| | | | |
|---|---|---|---|
| 2008/0112129 A1* | 5/2008 | Kuo | 361/687 |
| 2008/0186670 A1* | 8/2008 | Lyon et al. | 361/687 |
| 2008/0204995 A1* | 8/2008 | Fritz et al. | 361/688 |
| 2009/0201640 A1 | 8/2009 | Bard et al. | |
| 2010/0051243 A1* | 3/2010 | Ali et al. | 165/104.33 |
| 2010/0258377 A1 | 10/2010 | Cash et al. | |
| 2011/0051357 A1* | 3/2011 | Orr et al. | 361/679.48 |
| 2013/0250513 A1* | 9/2013 | WU et al. | 361/690 |

OTHER PUBLICATIONS

Disclosed Anonymously, "Flexible Rack Cooling System that Provides Adjustable, High-Volume Air Flow with Low Acoustical Noise", IP.com Prior Art Database, IPCOM000208521D, Jul. 11, 2011, pp. 1-4, IP.com, USA.

Basara, M., et al., "Folded Path Acoustic Attenuator", IP.com Prior Art Database, IPCOM000099965D, Mar. 1, 1990, pp. 1-3, IP.com, USA.

* cited by examiner

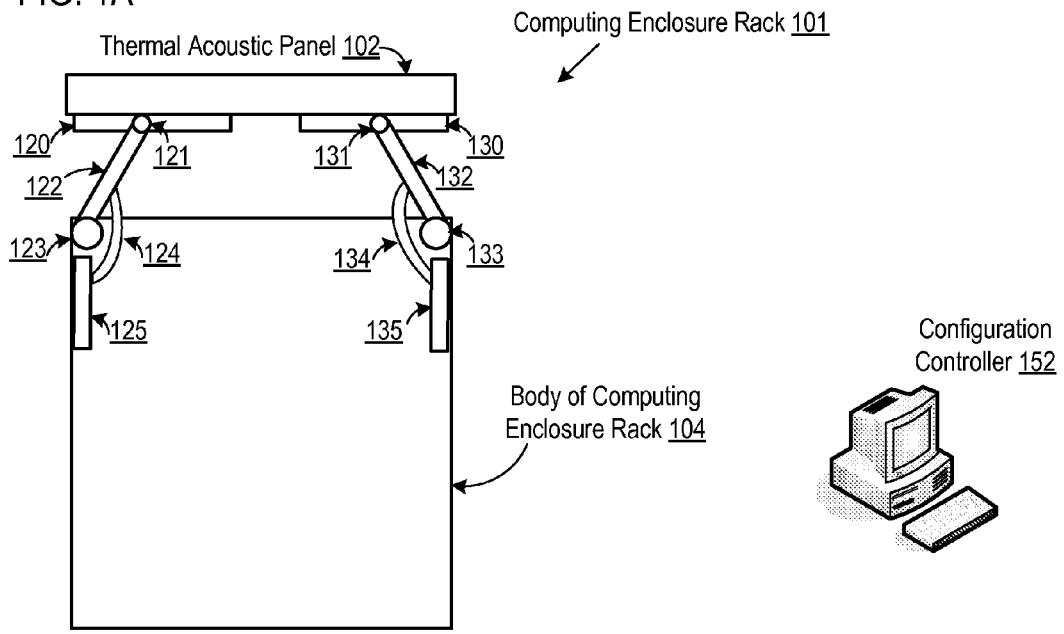
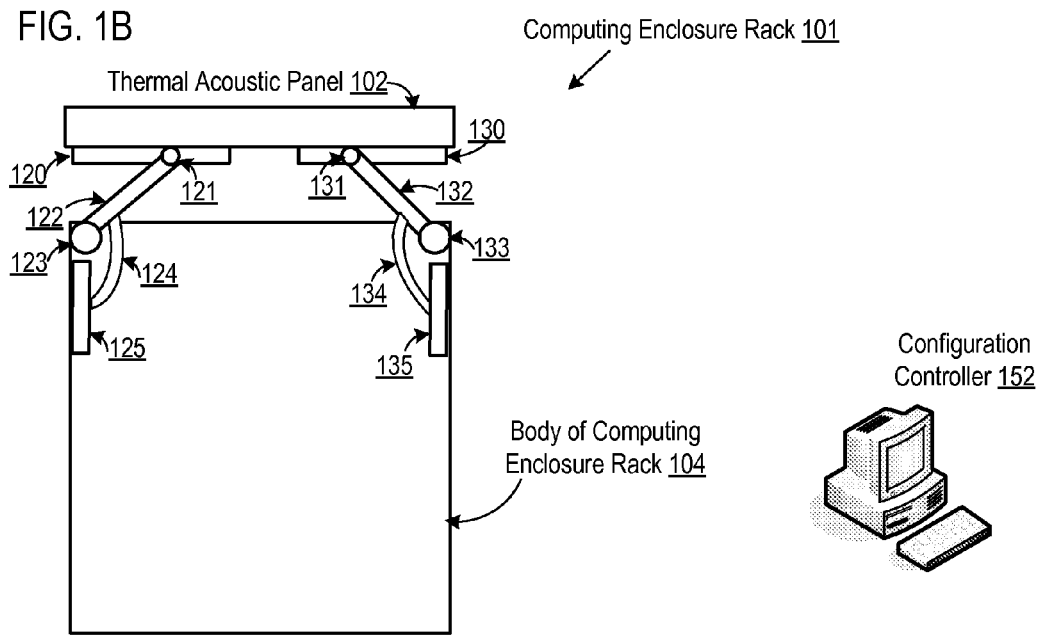

MODIFYING THE SPATIAL ORIENTATION OF A THERMAL ACOUSTIC PANEL OF A COMPUTING ENCLOSURE RACK

BACKGROUND OF THE INVENTION

1. Field of the Invention

The field of the invention is data processing, or, more specifically, methods, apparatuses, and computer program products for modifying the spatial orientation of a thermal acoustic panel of a computing enclosure rack.

2. Description Of Related Art

Computing systems are often stored together in a computing enclosure rack. During operation, the electrical components of the computing systems generate heat and noise. To cool the components, airflow is often directed through the computing enclosure rack. However, designing the computing enclosure rack to increase airflow may reduce the ability of the computing enclosure rack to dissipate noise generated by the components. As a result, finding the right balance between noise attenuation and airflow in the design of the computing enclosure rack may play an important role in the efficient operation of the components within the computing enclosure rack.

SUMMARY OF THE INVENTION

Methods, apparatuses, and computer program products for modifying the spatial orientation of a thermal acoustic panel of a computing enclosure rack are provided. Embodiments include receiving, by a configuration controller, a configuration preference from a user; identifying, by the configuration controller, a spatial orientation configuration corresponding to the configuration preference received from the user; and coordinating, by the configuration controller, movement of the thermal acoustic panel relative to a body of the computing enclosure rack in accordance with the identified spatial orientation configuration.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 1A sets forth a diagram of an example system that includes a computing enclosure rack comprising a thermal acoustic panel having a particular spatial orientation, modification of which is controlled by a configuration controller according to embodiments of the present invention.

FIG. 1B sets forth another diagram of an example system that includes a computing enclosure rack comprising a thermal acoustic panel having another spatial orientation, modification of which is controlled by a configuration controller according to embodiments of the present invention.

DETAILED DESCRIPTION OF EXEMPLARY EMBODIMENTS

Figure 1C:
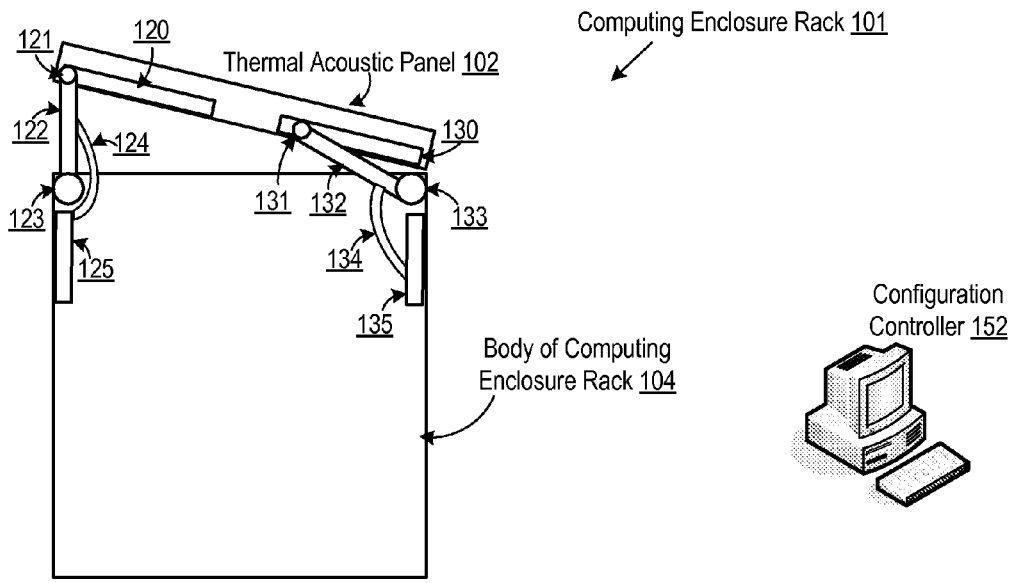
FIG. 1C sets forth another diagram of an example system that includes a computing enclosure rack comprising a thermal acoustic panel having another spatial orientation, modification of which is controlled by a configuration controller according to embodiments of the present invention.

Exemplary methods, apparatuses, and computer program products for modifying the spatial orientation of a thermal acoustic panel of a computing enclosure rack in accordance with the present invention are described with reference to the accompanying drawings, beginning with FIG. 1. FIG. 1A sets forth a diagram of an example system that includes a computing enclosure rack (101) comprising a thermal acoustic panel (102) having a particular spatial orientation, modification of which is controlled by a configuration controller (152) according to embodiments of the present invention.

A thermal acoustic panel is a computing enclosure rack panel having some combination of thermal dissipation properties and acoustic dissipation properties. For example, the thermal acoustic panel (102) of FIG. 1A may include a noise absorption material for attenuating the noise produced by the components operating within the computing enclosure rack. In addition, the thermal acoustic panel (102) also plays a role in controlling the direction and magnitude of airflow through the computing enclosure rack (101). The thermal dissipation and acoustic dissipation properties of the thermal acoustic panel (102) depend in large part upon the spatial orientation of the panel (102) relative to the body (104) of the computing enclosure rack (102). FIGS. 1A-1D illustrate several different spatial orientations. For example, the spatial orientation of FIG. 1A may allow for more airflow and less noise attenuation than the spatial orientation of FIG. 1D.

In the example of FIGS. 1A-1D, each side of the thermal acoustic panel (102) is capable of being moved. To move the thermal acoustic panel (102), the computing enclosure rack (101) includes a set of panel movers (125, 135) each of which controls a slider (124, 134) coupled to an arm (122, 132). Each arm (122, 132) rotates relative to a body (104) of the computing enclosure rack (101) on a particular hinge (123, 133). At the end of each arm is a bearing (121, 131) that slides in one of a set of tracks (120, 130) coupled to the thermal acoustic panel (102). In a particular embodiment, each arm is a separate thermal acoustic panel with specific thermal dissipation properties and acoustic dissipation properties. During operation, as a panel mover causes a slider to move, a corresponding arm rotates on a hinge causing a side of the thermal acoustic panel to move relative to the body (104) of the computing enclosure rack (101). Readers of skill in the art will recognize that the configuration controller may be configured to control any number of panels in any number of locations on one or more computing enclosure racks.

The configuration controller (152) is configured to control the movement of the thermal acoustic panel (102). In the example of FIG. 1, the configuration controller (152) is wirelessly or wired to, directly or indirectly to each panel mover (125, 135).

In the example of FIGS. 1A-1D, the configuration controller (152) is illustrated as a separate entity from the computing enclosure rack (101). However, readers of skill in the art will realize that the configuration controller (152) may be incorporated into the computing enclosure rack (101). The configuration controller is also configured to receive a configuration preference from a user; identify a spatial orientation configuration corresponding to the configuration preference received from the user; and coordinate movement of the thermal acoustic panel relative to a body of the computing enclosure rack in accordance with the identified spatial orientation configuration. That is, the configuration controller (152) is configured to automatically in real time adjust the spatial orientation of one or more thermal acoustic panels of a computing enclosure rack. The configuration controller (152) may also be configured to control other thermal acoustic panels of a computing enclosure rack.

In the example of FIG. 1A, each side of the thermal acoustic panel (102) is almost fully extended away from the body (104) of the computing enclosure rack (101). In contrast, in FIG. 1B, each side of the thermal acoustic panel (102) is partially extended away from the body (104) of the computing enclosure rack (101). To transition the thermal acoustic panel (102) from the spatial orientation configuration of FIG. 1A to the spatial orientation configuration of FIG. 1B, the configuration controller (152) may direct the panel moves (125, 135) to retract the arms (122, 132) by moving the sliders (124, 134) inward into the body (104) of the computing enclosure rack (101).

FIG. 1C sets forth another diagram of an example system that includes a computing enclosure rack comprising a thermal acoustic panel having another spatial orientation, modification of which is controlled by a configuration controller according to embodiments of the present invention. In the example of FIG. 1C, the left arm (122) is fully rotated outward and the right arm (132) is almost fully rotated inward.

Figure 1D:
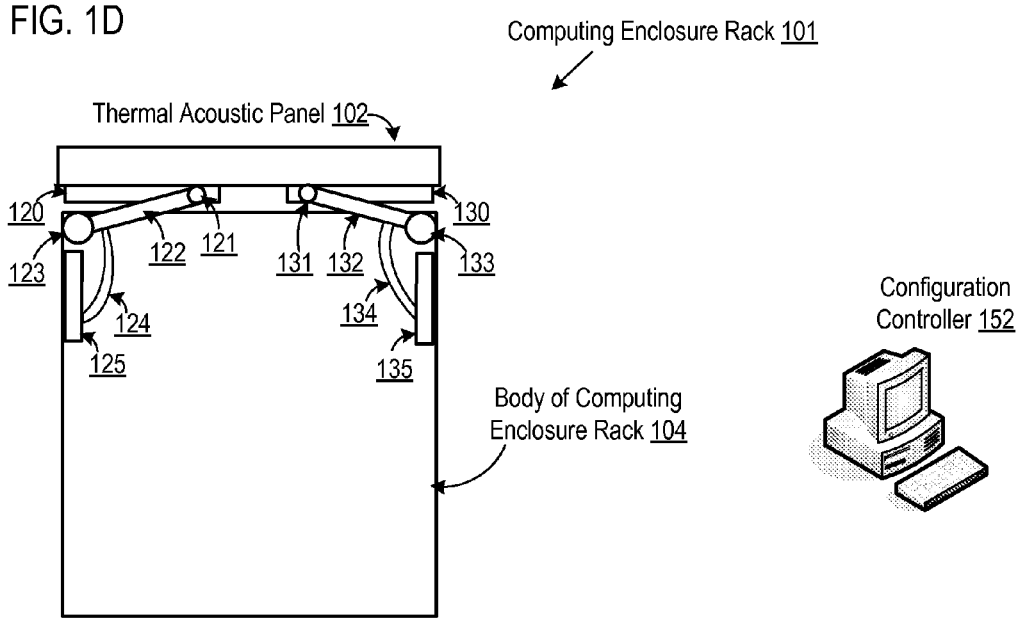
FIG. 1D sets forth another diagram of an example system that includes a computing enclosure rack comprising a thermal acoustic panel having another spatial orientation, modification of which is controlled by a configuration controller according to embodiments of the present invention.

FIG. 1D sets forth another diagram of an example system that includes a computing enclosure rack comprising a thermal acoustic panel having another spatial orientation, modification of which is controlled by a configuration controller according to embodiments of the present invention. In the example of FIG. 1D, each side of the thermal acoustic panel (102) is almost fully moved inward toward the body (104) of the computing enclosure rack (101).

Modifying the spatial orientation of a thermal acoustic panel of a computing enclosure rack in accordance with the present invention is generally implemented with computers, that is, with automated computing machinery. In the system of FIG. 1, for example, the configuration controller (152) is implemented to some extent at least as a computer. For further explanation, therefore, FIG. 2 sets forth a block diagram of automated computing machinery comprising an exemplary configuration controller (152) useful in modifying the spatial orientation of a thermal acoustic panel of a computing enclosure rack according to embodiments of the present invention. The configuration controller (152) of FIG. 2 includes at least one computer processor (256) or 'CPU' as well as random access memory (268) ('RAM') which is connected through a high speed memory bus (266) and bus adapter (258) to processor (256) and to other components of the configuration controller (152).

Stored in RAM (268) is a configuration controller module (299) that includes computer program instructions for modifying the spatial orientation of a thermal acoustic panel of a computing enclosure rack according to embodiments of the present invention. The configuration controller module (299) includes computer program instructions that when executed by the computer processor (256) cause the configuration controller (152) to carry out the steps of: receiving, by the configuration controller (152), a configuration preference from a user (201); identifying, by the configuration controller (152), a spatial orientation configuration corresponding to the configuration preference received from the user; and coordinating, by the configuration controller (152), movement of a thermal acoustic panel relative to a body of a computing enclosure rack in accordance with the identified spatial orientation configuration.

Also stored in RAM (268) is an operating system (254). Operating systems useful modifying the spatial orientation of a thermal acoustic panel of a computing enclosure rack according to embodiments of the present invention include UNIX™, Linux™, Microsoft XP™, AIX™, IBM's i5/OS™, and others as will occur to those of skill in the art. The operating system (254) and the configuration controller module (299) in the example of FIG. 2 are shown in RAM (268), but many components of such software typically are stored in non-volatile memory also, such as, for example, on a disk drive (270).

Figure 2:
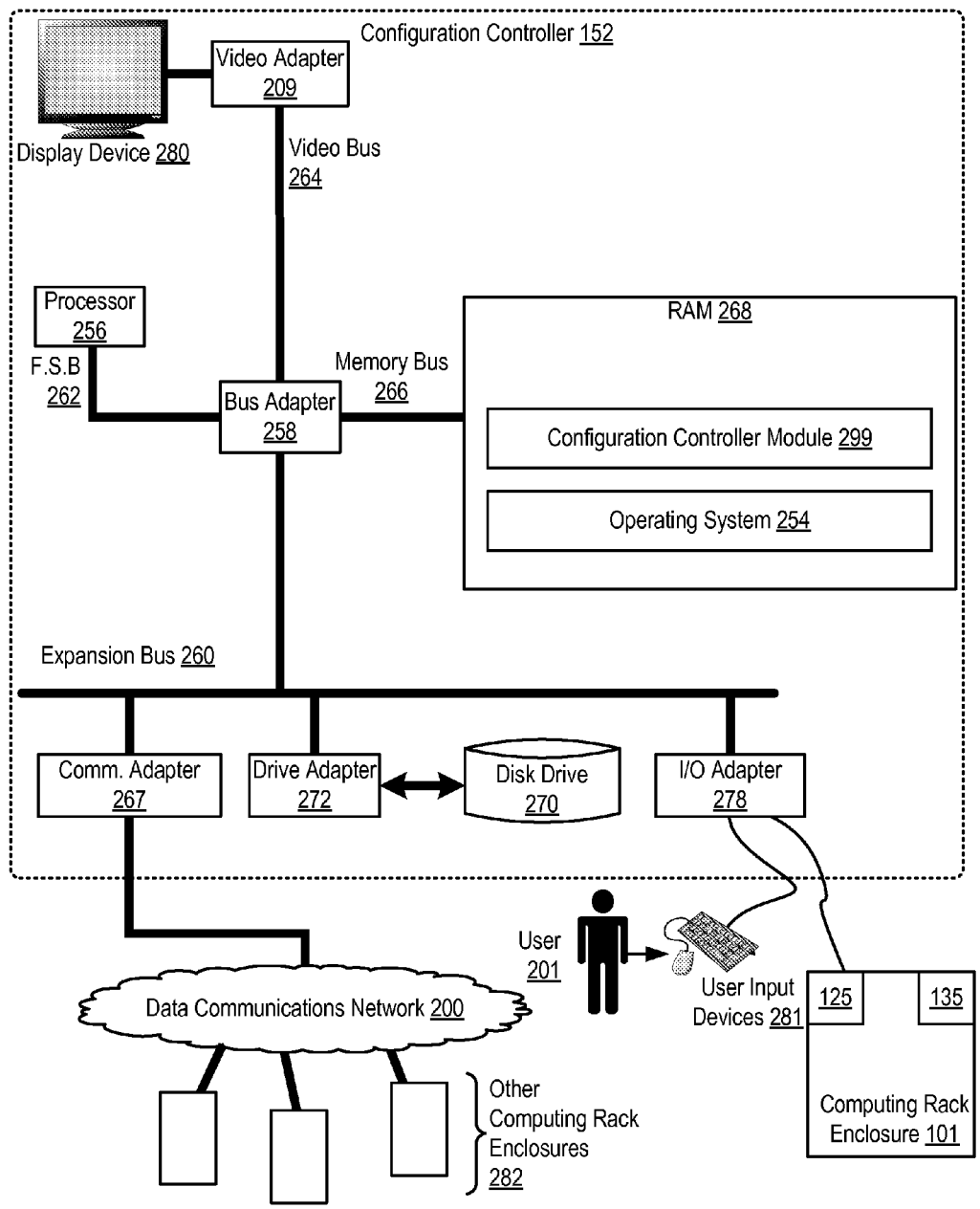
FIG. 2 sets forth a block diagram of automated computing machinery comprising an exemplary configuration controller useful in modifying the spatial orientation of a thermal acoustic panel of a computing enclosure rack according to embodiments of the present invention.

The configuration controller (152) of FIG. 2 includes disk drive adapter (272) coupled through expansion bus (260) and bus adapter (258) to processor (256) and other components of the configuration controller (152). Disk drive adapter (272) connects non-volatile data storage to the configuration controller (152) in the form of disk drive (270). Disk drive adapters useful in computers for modifying the spatial orientation of a thermal acoustic panel of a computing enclosure rack according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example configuration controller (152) of FIG. 2 includes one or more input/output ('I/O') adapters (278). I/O adapters implement user-oriented input/output through, for example, software drivers and computer hardware for controlling output to display devices such as computer display screens, as well as user input from user input devices (281) such as keyboards and mice and to the panel moves (125, 135) of the a computing rack enclosure (101). The example configuration controller (152) of FIG. 2 includes a video adapter (209), which is an example of an I/O adapter specially designed for graphic output to a display device (180) such as a display screen or computer monitor. Video adapter (209) is connected to processor (256) through a high speed video bus (264), bus adapter (258), and the front side bus (262), which is also a high speed bus.

The exemplary configuration controller (152) of FIG. 2 includes a communications adapter (267) for data communications other computing enclosure racks (282) as well as components of those computing enclosure racks, such as panel movers and other configuration controllers via a data communications network (200). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for modifying the spatial orientation of a thermal acoustic panel of a computing enclosure rack according to embodiments of the present invention include modems for wired dial-up communications, Ethernet (IEEE 802.3) adapters for wired data communications network communications, and 802.11 adapters for wireless data communications network communications.

Figure 3:
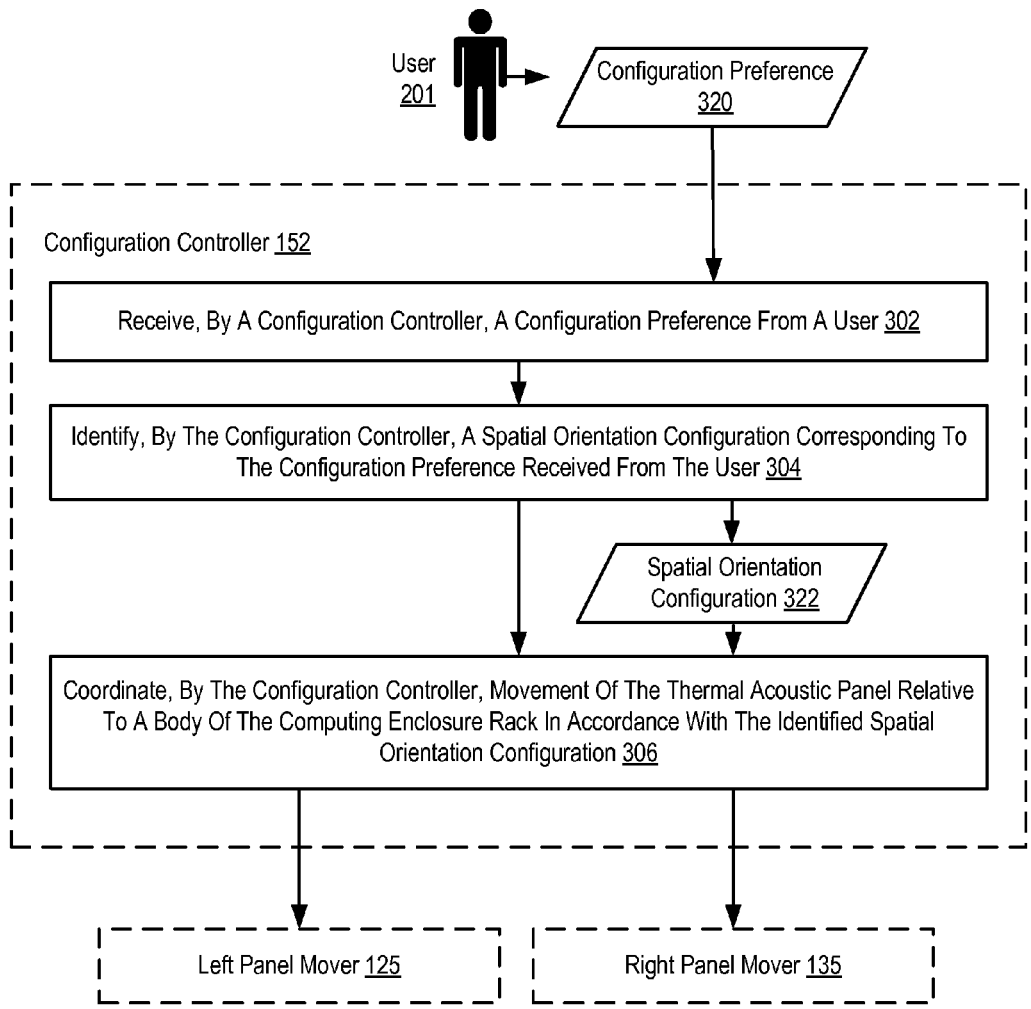
FIG. 3 sets forth a flow chart illustrating an exemplary method for modifying the spatial orientation of a thermal acoustic panel of a computing enclosure rack according to embodiments of the present invention.

For further explanation, FIG. 3 sets forth a flow chart illustrating an exemplary method for modifying the spatial orientation of a thermal acoustic panel of a computing enclosure rack according to embodiments of the present invention. The method of FIG. 3 includes receiving (302), by the configuration controller (152), a configuration preference (320) from a user (201). A configuration preference indicates thermal or acoustic preferences or information corresponding to thermal or acoustic implementations corresponding to the thermal acoustic panel (102) of the computing enclosure rack (101). Examples of configuration preferences include a thermal dissipation value, an acoustic dissipation value, and one or more values indicating space available for movement of the thermal acoustic panel (102). A thermal dissipation value is an indication of a thermal property of the thermal acoustic panel (102). Examples of thermal dissipation values include priority values indicating relative priority of thermal dissipation (e.g., a rating of two out of ten may indicate a low cooling priority). An acoustic dissipation value is an indication of an acoustic property of the thermal acoustic panel (102). Examples of acoustic dissipation values include priority values indicating relative priority of acoustic dissipation (e.g., a rating of eight out of ten may indicate a high acoustic dissipation priority). Receiving (302), by the configuration controller (152), a configuration preference (320) from a user (201) may be carried out by receiving I/O input from a keyboard or a touchpad attached to the configuration controller (152).

The method of FIG. 3 includes identifying (304), by the configuration controller (152), a spatial orientation configuration (322) corresponding to the configuration preference (320) received from the user (201). A spatial orientation configuration indicates the position of the thermal acoustic panel (102) relative to one or more other components of the computing enclosure rack. Identifying (304), by the configuration controller (152), a spatial orientation configuration (322) corresponding to the configuration preference (320) received from the user (201) may be carried out by creating a particular spatial orientation based on the configuration preference; looking up in a table that matches the information from the configuration preference with predetermined spatial orientation configurations; and selecting the spatial orientation configuration from a plurality of predefined spatial orientation configurations.

The method of FIG. 3 includes coordinating (306), by the configuration controller (152), movement of the thermal acoustic panel (102) relative to a body (104) of the computing enclosure rack (101) in accordance with the identified spatial orientation configuration (322). Coordinating (306), by the configuration controller (152), movement of the thermal acoustic panel (102) relative to a body (104) of the computing enclosure rack (101) in accordance with the identified spatial orientation configuration (322) may be carried out by instructing one or more other components of the computing enclosure rack (101) to move. In the example of FIG. 3, the configuration controller (152) is configured to control the movement of the left panel mover (125) and the right panel mover (135).

Figure 4:
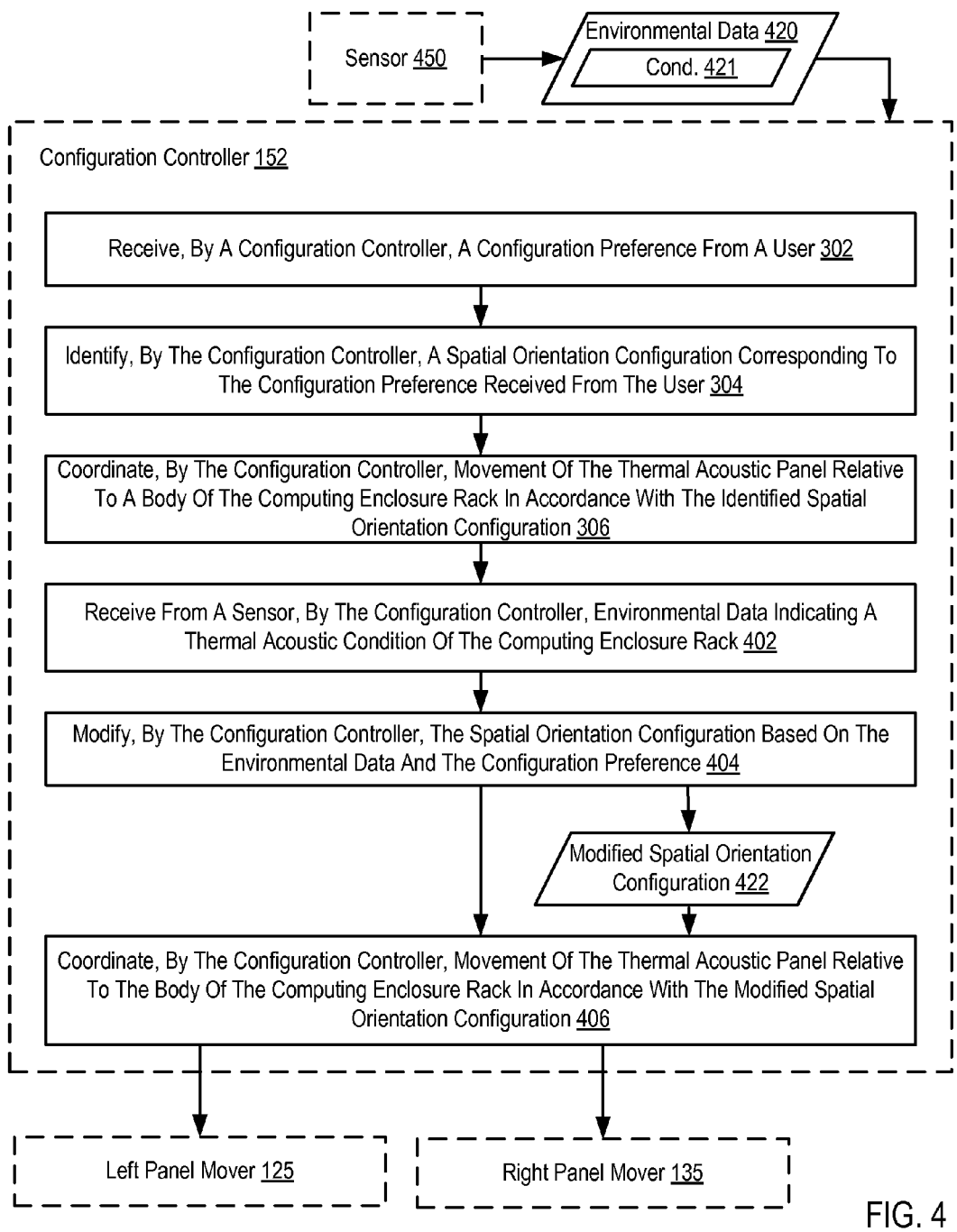
FIG. 4 sets forth a flow chart illustrating a further exemplary method for modifying the spatial orientation of a thermal acoustic panel of a computing enclosure rack according to embodiments of the present invention.

For further explanation, FIG. 4 sets forth a flow chart illustrating a further exemplary method for modifying the spatial orientation of a thermal acoustic panel of a computing enclosure rack according to embodiments of the present invention. The method of FIG. 4 is similar to the method of FIG. 3 in that the method of FIG. 4 includes receiving (302), by the configuration controller (152), a configuration preference (320) from a user (201); identifying (304), by the configuration controller (152), a spatial orientation configuration (322) corresponding to the configuration preference (320) received from the user (201); and coordinating (306), by the configuration controller (152), movement of the thermal acoustic panel (102) relative to a body (104) of the computing enclosure rack (101) in accordance with the identified spatial orientation configuration (322).

The method of FIG. 4 also includes receiving (402) from a sensor (450), by the configuration controller (152), environmental data (420) indicating a thermal acoustic condition (421) of the computing enclosure rack (101). A sensor is type of device that measures or collects environmental information corresponding to the computing enclosure rack and transmits the environmental information as environmental data to a configuration controller. Examples of sensors include a thermal sensor and an acoustic sensor. Receiving (402) from a sensor (450), by the configuration controller (152), environmental data (420) indicating a thermal acoustic condition (421) of the computing enclosure rack (101) may be carried out by receiving the environmental data via a wireless data communication network or via a direct wired connection between the configuration controller and the sensor.

The method of FIG. 4 includes modifying (404), by the configuration controller (152), the spatial orientation configuration (322) based on the environmental data (420) and the configuration preference (320). Modifying (404), by the configuration controller (152), the spatial orientation configuration (322) based on the environmental data (420) and the configuration preference (320) may be carried out by determining whether the particular spatial orientation configuration is achieving a desired thermal or acoustic setting; and adjusting the spatial orientation configuration to improve the chances that the modified spatial orientation configuration will achieve the desired thermal or acoustic setting. For example if a user specifies an acceptable noise level and an acceptable thermal level and the environmental data indicates the acceptable thermal level is exceeded, the configuration controller (152) modify the spatial orientation configuration to decrease resistance airflow from the thermal acoustic panel. Continuing with this example, if the modification to the spatial orientation configuration prevents the thermal acoustic panel from absorbing enough noise to be within the acceptable acoustic levels, the configuration controller (152) may further modify the spatial orientation configuration.

The method of FIG. 4 includes coordinating (406), by the configuration controller (152), movement of the thermal acoustic panel (102) relative to the body (104) of the computing enclosure rack (101) in accordance with the modified spatial orientation configuration (422). Coordinating (406), by the configuration controller (152), movement of the thermal acoustic panel (102) relative to the body (104) of the computing enclosure rack (101) in accordance with the modified spatial orientation configuration (422) may be carried out by instructing one or more other components of the computing enclosure rack (101) to move. In the example of FIG. 4, the configuration controller (152) is configured to control the movement of the left panel mover (125) and the right panel mover (135).

Figure 5:
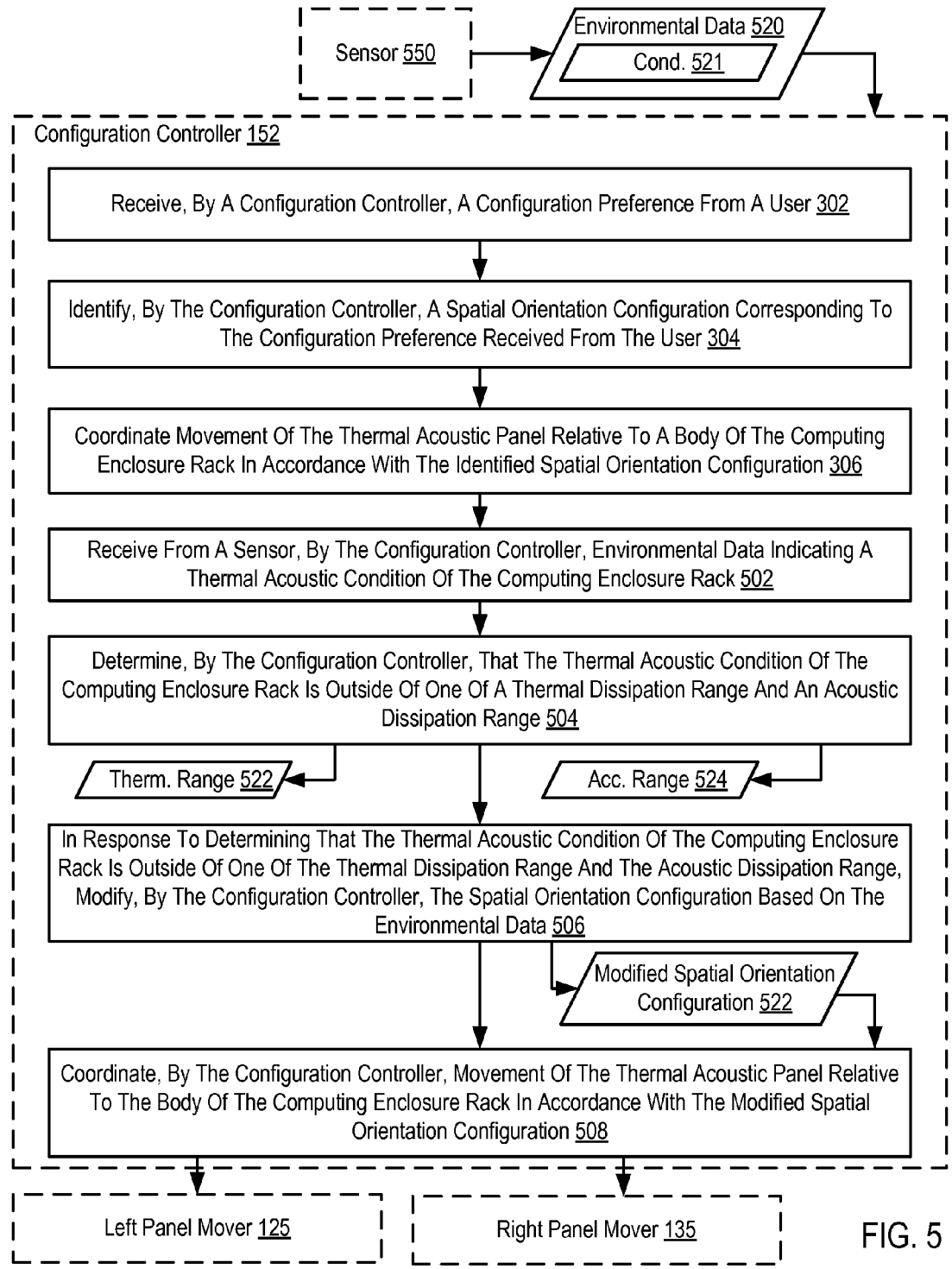
FIG. 5 sets forth a flow chart illustrating a further exemplary method for modifying the spatial orientation of a thermal acoustic panel of a computing enclosure rack according to embodiments of the present invention.

For further explanation, FIG. 5 sets forth a flow chart illustrating a further exemplary method for modifying the spatial orientation of a thermal acoustic panel of a computing enclosure rack according to embodiments of the present invention. The method of FIG. 5 is similar to the method of FIG. 3 in that the method of FIG. 5 includes receiving (302), by the configuration controller (152), a configuration preference (320) from a user (201); identifying (304), by the configuration controller (152), a spatial orientation configuration (322) corresponding to the configuration preference (320) received from the user (201); and coordinating (306), by the configuration controller (152), movement of the thermal acoustic panel (102) relative to a body (104) of the computing enclosure rack (101) in accordance with the identified spatial orientation configuration (322).

The method of FIG. 5 also includes receiving (502) from a sensor (550), by the configuration controller (152), environmental data (520) indicating a thermal acoustic condition (521) of the computing enclosure rack (101). Receiving (502) from a sensor (550), by the configuration controller (152), environmental data (520) indicating a thermal acoustic condition (521) of the computing enclosure rack (101) may be carried out by receiving the environmental data via a wireless data connection or via a direct wired connection between the configuration controller and the sensor.

The method of FIG. 5 also includes determining (504), by the configuration controller (152), that the thermal acoustic condition (521) of the computing enclosure rack (101) is outside of one of a thermal dissipation range (522) and an acoustic dissipation range (524). In the example of FIG. 5, the thermal dissipation range and the acoustic dissipation range correspond to the configuration preference. Determining (504), by the configuration controller (152), that the thermal acoustic condition (521) of the computing enclosure rack (101) is outside of one of a thermal dissipation range (522) and an acoustic dissipation range (524) may be carried out by comparing the environmental data to the thermal dissipation range and the acoustic dissipation range.

The method of FIG. 5 includes in response to determining that the thermal acoustic condition (521) of the computing enclosure rack (101) is outside of one of the thermal dissipation range (522) and the acoustic dissipation range (524), modifying (506), by the configuration controller (152), the spatial orientation configuration (522) based on the environmental data (520). Modifying (506), by the configuration controller (152), the spatial orientation configuration (522) based on the environmental data (520) may be carried out by determining whether the particular spatial orientation configuration is achieving a desired thermal or acoustic setting; and adjusting the spatial orientation configuration to improve the chances that the modified spatial orientation configuration will achieve the desired thermal or acoustic setting. That is, the configuration controller may be configured to adjust automatically in real time, the spatial orientation of a thermal acoustic panel to meet a user's needs as indicated by a configuration preference.

The method of FIG. 5 also includes coordinating (508), by the configuration controller (152), movement of the thermal acoustic panel (102) relative to the body (104) of the computing enclosure rack (101) in accordance with the modified spatial orientation configuration (522). Coordinating (508), by the configuration controller (152), movement of the thermal acoustic panel (102) relative to the body (104) of the computing enclosure rack (101) in accordance with the modified spatial orientation configuration (522) may be carried out by instructing one or more other components of the computing enclosure rack (101) to move. In the example of FIG. 5, the configuration controller (152) is configured to control the movement of the left panel mover (125) and the right panel mover (135).

Figure 6:
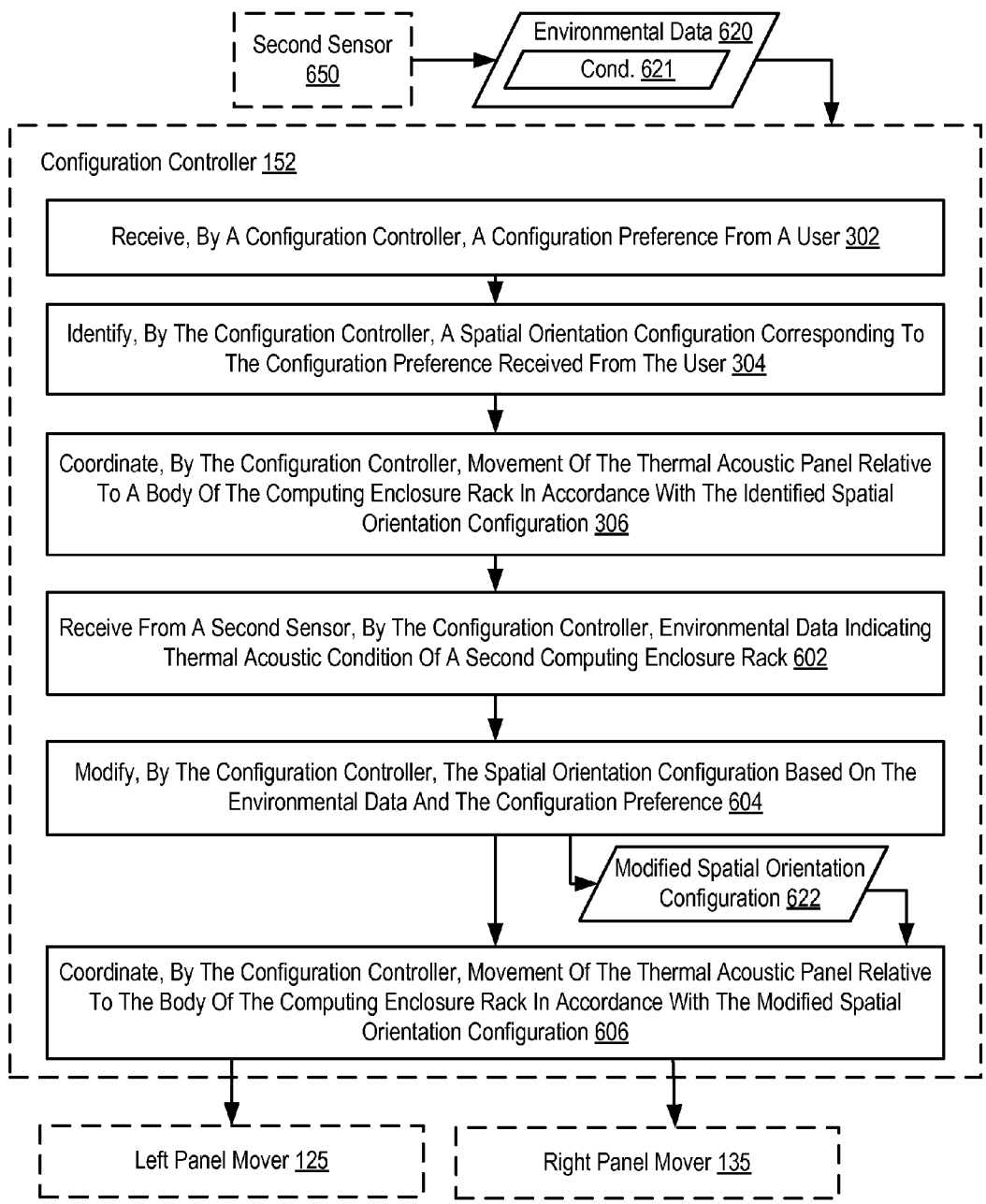
FIG. 6 sets forth a flow chart illustrating a further exemplary method for modifying the spatial orientation of a thermal acoustic panel of a computing enclosure rack according to embodiments of the present invention.

For further explanation, FIG. 6 sets forth a flow chart illustrating a further exemplary method for modifying the spatial orientation of a thermal acoustic panel of a computing enclosure rack according to embodiments of the present invention. The method of FIG. 6 is similar to the method of FIG. 3 in that the method of FIG. 6 includes receiving (302), by the configuration controller (152), a configuration preference (320) from a user (201); identifying (304), by the configuration controller (152), a spatial orientation configuration (322) corresponding to the configuration preference (320) received from the user (201); and coordinating (306), by the configuration controller (152), movement of the thermal acoustic panel (102) relative to a body (104) of the computing enclosure rack (101) in accordance with the identified spatial orientation configuration (322).

The method of FIG. 6 includes receiving (602) from a second sensor (650), by the configuration controller (152), environmental data (620) indicating a thermal acoustic condition (621) of a second computing enclosure rack (651). That is, the configuration controller (152) may be configured to consider the thermal acoustic conditions of additional computing enclosure racks while modifying the orientation of the thermal acoustic panel (102). Receiving (602) from a second sensor (650), by the configuration controller (152), environmental data (620) indicating a thermal acoustic condition (621) of a second computing enclosure rack (651) may be carried out by receiving the environmental data via a wireless data communication network or via a direct wired connection between the configuration controller and the sensor.

The method of FIG. 6 also includes modifying (604), by the configuration controller (152), the spatial orientation configuration (322) based on the environmental data (620) and the configuration preference (320). Modifying (604), by the configuration controller (152), the spatial orientation configuration (322) based on the environmental data (620) and the configuration preference (320) may be carried out by determining whether the particular spatial orientation configuration is achieving a desired thermal or acoustic setting; and adjusting the spatial orientation configuration to improve the chances that the modified spatial orientation configuration will achieve the desired thermal or acoustic setting.

The method of FIG. 6 also includes coordinating (606), by the configuration controller (152), movement of the thermal acoustic panel (102) relative to the body (104) of the computing enclosure rack (101) in accordance with the modified spatial orientation configuration (622). Coordinating (606), by the configuration controller (152), movement of the thermal acoustic panel (102) relative to the body (104) of the computing enclosure rack (101) in accordance with the modified spatial orientation configuration (622) may be carried out by instructing one or more other components of the computing enclosure rack (101) to move. In the example of FIG. 6, the configuration controller (152) is configured to control the movement of the left panel mover (125) and the right panel mover (135).

Exemplary embodiments of the present invention are described largely in the context of a fully functional computer system for modifying the spatial orientation of a thermal acoustic panel of a computing enclosure rack. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of modifying the spatial orientation of a thermal acoustic panel of a computing enclosure rack, the method comprising:
   receiving, by a configuration controller, a configuration preference from a user, the configuration preference comprising an acoustic dissipation value and a thermal dissipation value;
   identifying, by the configuration controller, a spatial orientation configuration corresponding to the configuration preference received from the user; and
   coordinating, by the configuration controller, movement of the thermal acoustic panel relative to a body of the computing enclosure rack in accordance with the identified spatial orientation configuration.

2. The method of claim 1 wherein the configuration preference also includes one or more values indicating space available for movement of the thermal acoustic panel.

3. The method of claim 1 further comprising:
   receiving from a sensor, by the configuration controller, environmental data indicating a thermal acoustic condition of the computing enclosure rack;
   modifying, by the configuration controller, the spatial orientation configuration based on the environmental data and the configuration preference; and
   coordinating, by the configuration controller, movement of the thermal acoustic panel relative to the body of the computing enclosure rack in accordance with the modified spatial orientation configuration.

4. The method of claim 3 wherein the sensor is at least one of a thermal sensor and an acoustic sensor.

5. The method of claim 1 further comprising:
   receiving from a sensor, by the configuration controller, environmental data indicating a thermal acoustic condition of the computing enclosure rack;
   determining, by the configuration controller, that the thermal acoustic condition of the computing enclosure rack is outside of one of a thermal dissipation range and an acoustic dissipation range, the thermal dissipation range and the acoustic dissipation range corresponding to the configuration preference;
   in response to determining that the thermal acoustic condition of the computing enclosure rack is outside of one of the thermal dissipation range and the acoustic dissipation range, modifying, by the configuration controller, the spatial orientation configuration based on the environmental data; and
   coordinating, by the configuration controller, movement of the thermal acoustic panel relative to the body of the computing enclosure rack in accordance with the modified spatial orientation configuration.

6. The method of claim 1, further comprising:
   receiving from a second sensor, by the configuration controller, environmental data indicating a thermal acoustic condition of a second computing enclosure rack;
   modifying, by the configuration controller, the spatial orientation configuration based on the environmental data and the configuration preference; and
   coordinating, by the configuration controller, movement of the thermal acoustic panel relative to the body of the computing enclosure rack in accordance with the modified spatial orientation configuration.

7. An apparatus for modifying the spatial orientation of a thermal acoustic panel of a computing enclosure rack, the apparatus comprising a computer processor, a computer memory operatively coupled to the computer processor, the computer memory having disposed within it computer program instructions that, when executed by the computer processor, cause the apparatus to carry out the steps of:
   receiving, by a configuration controller, a configuration preference from a user, the configuration preference comprising an acoustic dissipation value and a thermal dissipation value;
   identifying, by the configuration controller, a spatial orientation configuration corresponding to the configuration preference received from the user; and
   coordinating, by the configuration controller, movement of the thermal acoustic panel relative to a body of the computing enclosure rack in accordance with the identified spatial orientation configuration.

8. The apparatus of claim 7 wherein the configuration preference also includes one or more values indicating space available for movement of the thermal acoustic panel.

9. The apparatus of claim 7 further comprising computer program instructions that, when executed by the computer processor, cause the apparatus to carry out the steps of:
   receiving from a sensor, by the configuration controller, environmental data indicating a thermal acoustic condition of the computing enclosure rack;
   modifying, by the configuration controller, the spatial orientation configuration based on the environmental data and the configuration preference; and
   coordinating, by the configuration controller, movement of the thermal acoustic panel relative to the body of the computing enclosure rack in accordance with the modified spatial orientation configuration.

10. The apparatus of claim 9 wherein the sensor is at least one of a thermal sensor and an acoustic sensor.

11. The apparatus of claim 7 further comprising computer program instructions that, when executed by the computer processor, cause the apparatus to carry out the steps of:
   receiving from a sensor, by the configuration controller, environmental data indicating a thermal acoustic condition of the computing enclosure rack;
   determining, by the configuration controller, that the thermal acoustic condition of the computing enclosure rack is outside of one of a thermal dissipation range and an acoustic dissipation range, the thermal dissipation range and the acoustic dissipation range corresponding to the configuration preference;
   in response to determining that the thermal acoustic condition of the computing enclosure rack is outside of one of the thermal dissipation range and the acoustic dissipation range, modifying, by the configuration controller, the spatial orientation configuration based on the environmental data; and
   coordinating, by the configuration controller, movement of the thermal acoustic panel relative to the body of the computing enclosure rack in accordance with the modified spatial orientation configuration.

12. The apparatus of claim 7 further comprising computer program instructions that, when executed by the computer processor, cause the apparatus to carry out the steps of:

receiving from a second sensor, by the configuration controller, environmental data indicating a thermal acoustic condition of a second computing enclosure rack;

modifying, by the configuration controller, the spatial orientation configuration based on the environmental data and the configuration preference; and coordinating, by the configuration controller, movement of the thermal acoustic panel relative to the body of the computing enclosure rack in accordance with the modified spatial orientation configuration.

13. A computer program product for modifying the spatial orientation of a thermal acoustic panel of a computing enclosure rack, the computer program product disposed upon a computer readable medium, the computer program product comprising computer program instructions that, when executed, cause a computer to carry out the steps of:

receiving, by a configuration controller, a configuration preference from a user, the configuration preference comprising an acoustic dissipation value and a thermal dissipation value;

identifying, by the configuration controller, a spatial orientation configuration corresponding to the configuration preference received from the user; and coordinating, by the configuration controller, movement of the thermal acoustic panel relative to a body of the computing enclosure rack in accordance with the identified spatial orientation configuration.

14. The computer program product of claim 13 wherein the configuration preference also includes one or more values indicating space available for movement of the thermal acoustic panel.

15. The computer program product of claim 13 further comprising computer program instructions that, when executed, cause a computer to carry out the steps of:

receiving from a sensor, by the configuration controller, environmental data indicating a thermal acoustic condition of the computing enclosure rack;

modifying, by the configuration controller, the spatial orientation configuration based on the environmental data and the configuration preference; and coordinating, by the configuration controller, movement of the thermal acoustic panel relative to the body of the computing enclosure rack in accordance with the modified spatial orientation configuration.

16. The computer program product of claim 15 wherein the sensor is at least one of a thermal sensor and an acoustic sensor.

17. The computer program product of claim 13 further comprising computer program instructions that, when executed, cause a computer to carry out the steps of:

receiving from a sensor, by the configuration controller, environmental data indicating a thermal acoustic condition of the computing enclosure rack;

determining, by the configuration controller, that the thermal acoustic condition of the computing enclosure rack is outside of one of a thermal dissipation range and an acoustic dissipation range, the thermal dissipation range and the acoustic dissipation range corresponding to the configuration preference;

in response to determining that the thermal acoustic condition of the computing enclosure rack is outside of one of the thermal dissipation range and the acoustic dissipation range, modifying, by the configuration controller, the spatial orientation configuration based on the environmental data; and coordinating, by the configuration controller, movement of the thermal acoustic panel relative to the body of the computing enclosure rack in accordance with the modified spatial orientation configuration.

18. The computer program product of claim 13 further comprising computer program instructions that, when executed, cause a computer to carry out the steps of:

receiving from a second sensor, by the configuration controller, environmental data indicating a thermal acoustic condition of a second computing enclosure rack;

modifying, by the configuration controller, the spatial orientation configuration based on the environmental data and the configuration preference; and coordinating, by the configuration controller, movement of the thermal acoustic panel relative to the body of the computing enclosure rack in accordance with the modified spatial orientation configuration.

19. The computer program product of claim 13 wherein the computer readable medium comprises a signal medium.

20. The computer program product of claim 13 wherein the computer readable medium comprises a storage medium.

* * * * *